United States Patent
Neumeyer

(10) Patent No.: US 10,687,150 B2
(45) Date of Patent: Jun. 16, 2020

(54) BATTERY LIFE MONITOR SYSTEM AND METHOD

(75) Inventor: Frederick Charles Neumeyer, Austin, TX (US)

(73) Assignee: AUDIOTONIQ, INC., Austin, TX (US)

(*) Notice: Subject to any disclaimer, the term of this patent is extended or adjusted under 35 U.S.C. 154(b) by 549 days.

(21) Appl. No.: 13/290,269

(22) Filed: Nov. 7, 2011

(65) Prior Publication Data

US 2012/0130660 A1 May 24, 2012

Related U.S. Application Data

(60) Provisional application No. 61/416,688, filed on Nov. 23, 2010.

(51) Int. Cl.
| | | |
|---|---|---|
| *H04R 25/00* | (2006.01) | |
| *G01R 31/367* | (2019.01) | |
| *G01R 31/392* | (2019.01) | |

(52) U.S. Cl.
CPC ......... *H04R 25/305* (2013.01); *G01R 31/392* (2019.01); *G01R 31/367* (2019.01); *H04R 25/558* (2013.01); *H04R 2225/31* (2013.01); *H04R 2460/03* (2013.01)

(58) Field of Classification Search
CPC ............... H01M 10/48; H04R 2225/31; H04R 2460/03; H04R 25/305; G01R 31/3679; G01R 31/3651
USPC ..................................... 702/63, 62; 381/323
See application file for complete search history.

(56) References Cited

U.S. PATENT DOCUMENTS

| | | |
|---|---|---|
| 3,350,643 A | 10/1967 | Webb |
| 4,845,755 A | 7/1989 | Busch et al. |
| 4,947,432 A | 8/1990 | Topholm |
| 4,972,487 A | 11/1990 | Mangold et al. |
| 5,107,473 A | 4/1992 | Fuji et al. |
| 5,130,665 A | 7/1992 | Walden |
| 5,148,153 A | 9/1992 | Haymond |
| 5,303,306 A | 4/1994 | Brillhart et al. |

(Continued)

FOREIGN PATENT DOCUMENTS

| | | |
|---|---|---|
| DE | 19542961 C1 | 5/1997 |
| GB | 2473664 B | 1/2012 |

(Continued)

OTHER PUBLICATIONS

Berger, Elliott. "Dangerous Decibels: How Loud is Too Loud?" <www.dangerousdecibels.org/education/information-center/decibel-exposure-time-guidelines/>, accessed Dec. 23, 2013, 3 pages.

(Continued)

*Primary Examiner* — Eman A Alkafawi
(74) *Attorney, Agent, or Firm* — Polsinelli PC; Andrew Z. Weaver; Aleece Hayes

(57) ABSTRACT

An apparatus includes a battery, a plurality of circuit components operable independently, and a controller coupled to the battery and the plurality of circuit components and configured to control operation of the plurality of circuit components. The apparatus further includes a power consumption monitor coupled to the controller and configured to calculate a remaining battery life of the battery based on at least one operating time of a corresponding at least one of the plurality of circuit components.

17 Claims, 7 Drawing Sheets

(56) References Cited

U.S. PATENT DOCUMENTS

| | | | |
|---|---|---|---|
| 5,450,494 A | 9/1995 | Okubo et al. | |
| 5,524,056 A | 6/1996 | Killion et al. | |
| 5,524,150 A | 6/1996 | Sauer | |
| 5,563,951 A | 10/1996 | Wang et al. | |
| 5,608,803 A | 3/1997 | Magotra et al. | |
| 5,651,073 A | 7/1997 | Isu et al. | |
| 5,661,812 A | 8/1997 | Scofield et al. | |
| 5,666,426 A | 9/1997 | Helms | |
| 5,692,058 A | 11/1997 | Eggers et al. | |
| 5,721,783 A | 2/1998 | Anderson | |
| 5,727,070 A | 3/1998 | Coninx | |
| 5,734,731 A | 3/1998 | Marx | |
| 5,734,964 A | 3/1998 | Fishman et al. | |
| 5,734,976 A * | 3/1998 | Bartschi et al. | 455/333 |
| 5,764,775 A | 6/1998 | Kim | |
| 5,768,397 A | 6/1998 | Fazio | |
| 5,802,183 A | 9/1998 | Scheller et al. | |
| 5,812,598 A | 9/1998 | Sharma et al. | |
| 5,824,022 A | 10/1998 | Zilberman et al. | |
| 5,867,581 A | 2/1999 | Obara | |
| 5,873,126 A * | 2/1999 | Singh | 711/205 |
| 6,078,675 A | 6/2000 | Bowen-Nielsen et al. | |
| 6,151,400 A | 11/2000 | Seligman | |
| 6,265,989 B1 | 7/2001 | Taylor | |
| 6,330,339 B1 | 12/2001 | Ishige et al. | |
| 6,532,294 B1 | 3/2003 | Rudell et al. | |
| 6,694,034 B2 | 2/2004 | Julstrom et al. | |
| 6,741,712 B2 | 5/2004 | Bisgaard | |
| 6,794,852 B2 | 10/2004 | Tran | |
| 6,920,229 B2 | 7/2005 | Boesen et al. | |
| 7,010,133 B2 | 3/2006 | Chalupper et al. | |
| 7,050,907 B1 | 5/2006 | Janky et al. | |
| 7,167,571 B2 | 1/2007 | Bantz et al. | |
| 7,301,305 B2 | 11/2007 | Tran | |
| 7,324,650 B2 | 1/2008 | Fischer et al. | |
| 7,336,227 B2 | 2/2008 | Durst et al. | |
| 7,397,217 B2 | 7/2008 | Van Brocklin et al. | |
| 7,446,505 B2 | 11/2008 | Paul et al. | |
| 7,451,256 B2 | 11/2008 | Hagen et al. | |
| 7,499,686 B2 | 3/2009 | Sinclair et al. | |
| 7,519,194 B2 | 4/2009 | Niederdrank et al. | |
| 7,529,545 B2 | 5/2009 | Rader et al. | |
| 7,561,708 B2 | 7/2009 | Röhrlein et al. | |
| 7,593,822 B2 * | 9/2009 | Stewart | G06K 7/0008 702/63 |
| 7,610,035 B2 | 10/2009 | Van Bosch et al. | |
| 7,640,101 B2 | 12/2009 | Pair et al. | |
| 7,676,335 B2 * | 3/2010 | Ahmed et al. | 702/63 |
| 7,715,576 B2 | 5/2010 | Ribic et al. | |
| 7,778,432 B2 | 8/2010 | Larsen et al. | |
| 7,787,647 B2 | 8/2010 | Hagen et al. | |
| 7,826,631 B2 | 11/2010 | Fischer et al. | |
| 7,853,028 B2 | 12/2010 | Fischer et al. | |
| 7,929,722 B2 | 4/2011 | Shridhar et al. | |
| 7,933,419 B2 | 4/2011 | Roeck et al. | |
| 8,170,884 B2 | 5/2012 | Vaudrey et al. | |
| 8,265,315 B2 | 9/2012 | Sørensen et al. | |
| 8,379,871 B2 | 2/2013 | Michael et al. | |
| 8,457,335 B2 | 6/2013 | Imamura et al. | |
| 8,515,110 B2 | 8/2013 | Neumeyer et al. | |
| 8,526,649 B2 | 9/2013 | Foo et al. | |
| 8,611,570 B2 | 12/2013 | Neumeyer et al. | |
| 8,649,538 B2 | 2/2014 | Apfel et al. | |
| 8,654,999 B2 | 2/2014 | Mindlin, II et al. | |
| 8,761,421 B2 | 6/2014 | Apfel et al. | |
| 8,787,603 B2 | 7/2014 | Fichtl et al. | |
| 8,810,392 B1 | 8/2014 | Teller et al. | |
| 9,071,917 B2 | 6/2015 | Apfel | |
| 9,167,339 B2 | 10/2015 | Knox et al. | |
| 9,191,756 B2 | 11/2015 | Neumeyer et al. | |
| 2003/0008659 A1 | 1/2003 | Waters et al. | |
| 2003/0055537 A1 | 3/2003 | Odinak et al. | |
| 2003/0059076 A1 | 3/2003 | Martin | |
| 2003/0069704 A1 * | 4/2003 | Bean | G01R 31/3648 702/63 |
| 2003/0215105 A1 | 11/2003 | Sacha | |
| 2004/0059446 A1 | 3/2004 | Goldberg et al. | |
| 2004/0199146 A1 * | 10/2004 | Rogers | A61M 5/14276 604/891.1 |
| 2004/0215408 A1 * | 10/2004 | Lamer | G06F 1/3203 702/63 |
| 2005/0036637 A1 | 2/2005 | Janssen | |
| 2005/0277994 A1 * | 12/2005 | McNamee et al. | 607/29 |
| 2005/0281424 A1 | 12/2005 | Rass et al. | |
| 2006/0182294 A1 | 8/2006 | Grasbon et al. | |
| 2006/0198530 A1 | 9/2006 | Fischer et al. | |
| 2007/0014423 A1 | 1/2007 | Darbut et al. | |
| 2007/0098195 A1 | 5/2007 | Holmes | |
| 2007/0214893 A1 | 9/2007 | Killion et al. | |
| 2007/0254728 A1 | 11/2007 | Moallemi et al. | |
| 2007/0255435 A1 | 11/2007 | Cohen et al. | |
| 2007/0274531 A1 | 11/2007 | Camp et al. | |
| 2008/0037797 A1 | 2/2008 | Goldstein et al. | |
| 2008/0136654 A1 * | 6/2008 | Toriello et al. | 340/636.1 |
| 2008/0137873 A1 | 6/2008 | Goldstein et al. | |
| 2008/0167531 A1 * | 7/2008 | McDermott | 600/300 |
| 2008/0240477 A1 | 10/2008 | Howard et al. | |
| 2009/0074216 A1 | 3/2009 | Bradford et al. | |
| 2009/0119038 A1 * | 5/2009 | Bell, Jr. | B60L 3/12 702/62 |
| 2009/0208024 A1 | 8/2009 | Farver et al. | |
| 2009/0262964 A1 | 10/2009 | Havenith et al. | |
| 2009/0290721 A1 | 11/2009 | Goldstein et al. | |
| 2010/0027822 A1 | 2/2010 | Dietz | |
| 2010/0054511 A1 | 3/2010 | Wu et al. | |
| 2010/0098278 A1 * | 4/2010 | Sorensen | H04R 25/554 381/323 |
| 2010/0191490 A1 * | 7/2010 | Martens | G01R 31/3648 702/63 |
| 2010/0202637 A1 | 8/2010 | Cornelisse et al. | |
| 2010/0255782 A1 | 10/2010 | Klemmensen | |
| 2010/0273452 A1 | 10/2010 | Rajann et al. | |
| 2010/0296668 A1 | 11/2010 | Lee et al. | |
| 2010/0321647 A1 * | 12/2010 | Schuler | G06F 1/3203 353/121 |
| 2011/0033073 A1 * | 2/2011 | Inoshita | H04R 25/552 381/323 |
| 2011/0040990 A1 * | 2/2011 | Chan | G06F 1/28 713/300 |
| 2011/0176697 A1 | 7/2011 | Apfel et al. | |
| 2011/0178745 A1 * | 7/2011 | Kobayashi | G01R 31/3682 702/63 |
| 2011/0200215 A1 | 8/2011 | Apfel et al. | |
| 2011/0243345 A1 | 10/2011 | Carreras et al. | |
| 2011/0249836 A1 | 10/2011 | Solum et al. | |
| 2012/0082329 A1 | 4/2012 | Neumeyer et al. | |
| 2013/0301860 A1 | 11/2013 | Neumeyer et al. | |
| 2014/0003641 A1 | 1/2014 | Neumeyer et al. | |
| 2015/0256946 A1 | 9/2015 | Neumeyer et al. | |

FOREIGN PATENT DOCUMENTS

| | | |
|---|---|---|
| WO | 1998043192 A1 | 1/1998 |
| WO | 2006117365 A1 | 11/2006 |
| WO | 2008071236 A1 | 6/2008 |
| WO | 2009001559 A1 | 12/2008 |
| WO | 2010073749 A1 | 7/2010 |
| WO | 2011159349 | 12/2011 |

OTHER PUBLICATIONS

United States Patent and Trademark Office, Final Office Action, U.S. Appl. No. 13/007,568, dated May 30, 2013, 19 pages.

United States Patent and Trademark Office, Final Office Action, U.S. Appl. No. 13/176,738, dated May 22, 2014, 11 pages.

United States Patent and Trademark Office, Final Office Action, U.S. Appl. No. 13/708,009, dated Jul. 30, 2014, 9 pages.

United States Patent and Trademark Office, Final Office Action, U.S. Appl. No. 13/935,744, dated Jun. 10, 2015, 9 pages.

International Searching Authority/United States, International Search Report and Written Opinion, PCT Patent Application PCT/US2011/001077, dated Nov. 15, 2011, 9 pages.

(56) References Cited

OTHER PUBLICATIONS

United States Patent and Trademark Office, Non-Final Office Action, U.S. Appl. No. 13/007,568, dated Dec. 12, 2012, 19 pages.
United States Patent and Trademark Office, Non-Final Office Action, U.S. Appl. No. 13/176,738, dated Feb. 18, 2015, 5 pages.
United States Patent and Trademark Office, Non-Final Office Action, U.S. Appl. No. 13/176,738, dated Jan. 16, 2014, 13 pages.
United States Patent and Trademark Office, Non-Final Office Action, U.S. Appl. No. 13/176,738, dated Jul. 18, 2013, 16 pages.
United States Patent and Trademark Office, Non-Final Office Action, U.S. Appl. No. 13/708,009, dated Jan. 21, 2014, 7 pages.
United States Patent and Trademark Office, Non-Final Office Action, U.S. Appl. No. 13/935,744, dated Aug. 7, 2015, 10 pages.
United States Patent and Trademark Office, Non-Final Office Action, U.S. Appl. No. 13/935,744, dated Dec. 26, 2014, 6 pages.
United States Patent and Trademark Office, Non-Final Office Action, U.S. Appl. No. 13/935,744, dated Feb. 20, 2015, 10 pages.
United States Patent and Trademark Office, Notice of Allowance, U.S. Appl. No. 13/007,568, dated Feb. 14, 2014, 5 pages.
United States Patent and Trademark Office, Notice of Allowance, U.S. Appl. No. 13/176,738, dated Jun. 17, 2015, 9 pages.
United States Patent and Trademark Office, Notice of Allowance, U.S. Appl. No. 13/244,260, dated May 1, 2013, 12 pages.
United States Patent and Trademark Office, Notice of Allowance, U.S. Appl. No. 13/708,009, dated Feb. 27, 2015, 5 pages.
GN ReSound Group, USA. ReSound Alera: End User Brochure. Instructional brochure M101100-GB-10.02 Rev.A, 2010, 7 pages.
United States Patent and Trademark Office, Restriction Requirement, U.S. Appl. No. 13/708,009, dated Nov. 28, 2014, 5 pages.
United States Patent and Trademark Office, Restriction Requirement, U.S. Appl. No. 13/935,744, dated Oct. 10, 2014, 6 pages.
United States Patent and Trademark Office, Restriction Requirement, U.S. Appl. No. 14/719,544, dated Aug. 27, 2015, 5 pages.
United States Patent and Trademark Office, Notice of Allowance, U.S. Appl. No. 13/935,744, dated Jun. 2, 2016, 9 pages.
United States Patent and Trademark Office, Notice of Allowance, U.S. Appl. No. 14/419,544, dated Jul. 13, 2016, 6 pages.
Petition for Inter Partes Review of U.S. Pat. No. 9,191,756, filed Jan. 27, 2017.
Declaration of Robert K. Morrow Ph.D. filed in Petition for Inter Partes Review of U.S. Pat. No. 9,191,756, filed Jan. 27, 2017.
Petition for Inter Partes Review of U.S. Pat. No. 8,654,999 filed Jan. 27, 2017.
Declaration 2017 of Les Atlas Ph.D. filed in Petition for Inter Partes Review of U.S. Pat. No. 8,654,999, filed Jan. 27, 2017.
Petition for Inter Partes Review of U.S. Pat. No. 8,761,421 filed Dec. 21, 2016.
Declaration of Robert E. Morley, Jr. D.Sc. filed in Petition for Inter Partes Review of U.S. Pat. No. 8,761,421, filed Dec. 21, 2016.
Petition for Inter Partes Review of U.S. Pat. No. 7,640,101 filed Dec. 12, 2016.
Declaration of Sayfe Kiaei Ph.D. filed in Petition for Inter Partes Review of U.S. Pat. No. 7,640,101, filed Dec. 12, 2016.
Petition for Inter Partes Review of U.S. Pat. No. 8,649,538 filed Dec. 6, 2016.
Declaration of Les Atlas Ph.D. filed in Petition for Inter Partes Review of U.S. Pat. No. 8,649,538, filed Dec. 6, 2016.
Petition for Inter Partes Review of U.S. Pat. No. 8,611,570 filed Dec. 6, 2016.
Declaration of Sayfe Kiaei Ph.D. filed in Petition for Inter Partes Review of U.S. Pat. No. 8,611,570, filed Dec. 6, 2016.
Petition for Inter Partes Review of U.S. Pat. No. 6,694,034 filed Jan. 3, 2017.
Declaration of Robert E. Morley, Jr. D.Sc. filed in Petition for Inter Partes Review of U.S. Pat. No. 6,694,034 filed Jan. 3, 2017.
Petition for Inter Partes Review of U.S. Pat. No. 7,929,722 filed Feb. 17, 2017.
Declaration of Les Atlas Ph.D. filed in Petition for Inter Partes Review of U.S. Pat. No. 7,929,722 filed Feb. 17, 2017.
Petition for Inter Partes Review of U.S. Pat. No. 8,170,884 filed Feb. 21, 2017.
Declaration of Sayfe Kiaei Ph.D. filed in Petition for Inter Partes Review of U.S. Pat. No. 8,170,884 filed Feb. 21, 2017.
File History of U.S. Pat. No. 9,191,756, filed on Dec. 7, 2012, issued on Nov. 17, 2015.
American Heritage Dictionary, published in 2011, p. 1652.
Barron's Dictionary of Computer and Internet Terms, published in 2013, p. 457.
Ira Sager, "Before IPhone and Android Came Simon, the First Smartphone", Jun. 29, 2012; Retrieved from www.bloomberg.com on Jan. 23, 2017.
Taylor Martin, "The Evolution of the Smartphone", Jul. 29, 2014; Retrieved from www.pocketnow.com on Jan. 23, 2017.
Sangeeta Mukherjee, "Smartphone Evolution From IBM Simon to Samsung-Galaxy S3", May 8, 2012; Retrieved from www.ibtimes.com on Jan. 23, 2017.
B. Kasoff, "A Closer Look the Evolution of the Smart Phone", Sep. 19, 2014; Retrieved from www.blog.wipp.org on Jan. 23, 2017.
File History of U.S. Pat. No. 8,654,999, filed on Apr. 12, 2011, issued on Feb. 18, 2014.
Michael Valente, "Guideline for Audiologic Management of the Adult Patient", Oct. 30, 2006; Retrieved from http://www.audiologyonline.com/ on Dec. 14, 2016.
ISA Good Practice Guidance, "Good Practice Guidance for Adult Hearing Aid Fittings and Services—Background to the Document and Consultation", Nov. 2004.
Gitte Keidser et al, "Variation in preferred gain with experience for hearing-aid user", 2008, International Journal of Audiology 47:10, 621-635, retrieved from University of Washington Libraries on Jan. 4, 2017.
Harvey Dillon et al, "The trainable hearing aid: What will it do for clients and clinicians?", The Hearing Journal 59:4, 30-36, Apr. 2006.
Non-Final Office Action dated Dec. 12, 2012 from U.S. Pat. No. 8,761,421 Patent Prosecution History.
Response to Dec. 12, 2012 Non-Final Office Action filed Mar. 1, 2013 from U.S. Pat. No. 8,761,421 Patent Prosecution History.
Final Office Action dated May 30, 2013 from U.S. Pat. No. 8,761,421 Patent Prosecution History.
Response to May 30, 2013 Final Office Action filed Jul. 10, 2013 from U.S. Pat. No. 8,761,421 Patent Prosecution History.
File History of U.S. Pat. No. 7,640,101, filed on Jun. 24, 2004, issued on Dec. 29, 2009.
Richard B. Langley, "NMEA 0183: A GPS Receiver Interface Standard", (1995) GPS World, 54-57.
Ken Lassesen, "Creating 16-Bit and 32-Bit Screen Savers with Visual Basic" Jun. 29, 1995, Microsoft Developer Network Technology Group, Retrieved from http://msdn.microsoft.com on Oct. 20, 2007.
Prosecution History of U.S. Pat. No. 8,649,538, filed on Feb. 8, 2011, issued on Feb. 11, 2014.
Consumer Reports,—Hear Well in a Noisy World—Features at a glance Jul. 2009, Consumer Reports Magazine, Retrieved from www.consumerreports.org on Nov. 18, 2016.
Bernard Widrow et al, "Microphone Arrays for Hearing Aids: An Overview", Jan. 2003, Journal of Speech Communication, 39, 139-146.
Gary P. Rodriguez et al, "Preferred Hearing Aid Response Characteristics Under Acoustic and Telecoil Coupling Conditions" Nov. 1993, American Journal of Audiology, 55-59 , Retrieved from http://aja.pubs.asha.org on Apr. 13, 2016.
Non-Final Office Action dated Jun. 4, 2013 from U.S. Pat. No. 8,611,570 Patent Prosecution History.
Response to Jun. 4, 2013 Final Office Action filed Aug. 16, 2013 from U.S. Pat. No. 8,611,570 Patent Prosecution History.
Certified English Translation of WO/2009/001559, Oct. 20, 2016.
Prosecution History of U.S. Pat. No. 6,694,034, filed on Dec. 28, 2000, issued on Feb. 12, 2004.
Tooley, Michael, "Data Communications Pocket Book" 2nd Edition 1989,1992, Butterworth-Heinemann Ltd, Linacre House, Jordan Hill Oxford OX2 8DP.

(56) References Cited

OTHER PUBLICATIONS

Patent File History of U.S. Pat. No. 7,929,722, filed on Nov. 18, 2008, issued on Apr. 19, 2011.
Prosecution History of U.S. Pat. No. 8,170,884, filed on Jan. 8, 2008, issued on May 1, 2012.
Parker, Sybil P., "McGraw-Hill Dictionary of Scientific and Technical Terms", Fifth Edition, 1974, 1994, McGraw-Hill, USA.
United States Patent and Trademark Office, Non-Final Office Action, U.S. Appl. No. 14/719,544, dated Mar. 28, 2016, 5 pages.

\* cited by examiner

| Energy Characterization Table ||
|---|---|
| Process | Energy Used Per Second |
| MCU(1) | $3.5 \times 10^{-7}$ mW |
| MCU(2) | $7.0 \times 10^{-7}$ mW |
| Processor(1) | $9.5 \times 10^{-7}$ mW |
| Processor(2) | $1.5 \times 10^{-7}$ mW |
| Microphone(1) | $7.8 \times 10^{-7}$ mW |
| Microphone(2) | $6.3 \times 10^{-7}$ mW |

| Operations Table | | |
|---|---|---|
| Operation | Start Time | End Time |
| MCU(1) | 05:35:41 | 05:35:44 |
| MCU(2) | 06:21:02 | 06:21:09 |
| Processor(1) | 14:10:19 | 14:11:03 |
| MCU(1) | 08:05:50 | 08:06:01 |
| Microphone(2) | 05:21:35 | |

FIG. 3

BATTERY LIFE MONITOR SYSTEM AND METHOD

CROSS-REFERENCE TO RELATED APPLICATION(S)

This application is a non-provisional patent application of and claims priority to U.S. Provisional Patent Application No. 61/416,688 filed on Nov. 23, 2010 and entitled "Battery Life Monitor Systems and Methods", which is incorporated herein by reference in its entirety.

FIELD

This disclosure relates generally to battery life monitoring systems, and more particularly to systems and methods for determining remaining battery life in portable battery-powered systems.

BACKGROUND

Many electronic devices include a battery life indicator to provide an indication of how much time a user can continue to use the device before the battery runs down. Consumers expect an accurate indication of current battery life in battery powered electronic devices.

Conventional battery life detection circuits can use analog current measurements or voltage measurements to determine the battery life. Analog current measurements tend to be very accurate and provide consumers with a relatively reliable indication of battery life over the duration of the electronic devices usage. Such measurement circuits often determine the remaining charge stored by the battery as a function of the measured current, which can be characterized for the particular battery. However, this accuracy comes at a cost of larger and more expensive electronic devices and reduced battery life.

In electronic devices, such as notebook computers, PDAs (personal digital assistant), portable music players, and mobile (cellular or digital) phones, the additional circuitry required to measure current cannot be accommodated without increasing the overall size of the device. Accordingly, such portable devices often measure voltage to determine battery life instead. While voltage measurement circuitry is often cheaper and typically occupies less space and uses less hardware than analog current measurement circuitry, such voltage measurement circuitry often produces a less accurate battery life indicator.

Voltage measurement circuitry measures the voltage level over time, detecting a distinct drop off when the remaining charge of the battery approaches zero volts. In some instances, the measurement circuitry generates a signal in response to the abrupt change in the voltage level, which is reflected by an abrupt change in the battery life indicator, such as a rapid change from over fifty percent remaining to under ten percent in a matter of minutes for rechargeable batteries that typically last for several hours. On portable computing devices and cell phone devices, the voltage measurement circuitry does not reflect consistent power consumption, which means that the battery indicator may not accurately reflect the remaining battery life. Such voltage-measurement-based battery indicators can change very little over a period of time and then can change very abruptly when the battery is almost completely discharged, causing the battery life indicator to change from two hours remaining to, for example, fifteen minutes remaining over the course of a few minutes.

BRIEF DESCRIPTION OF THE DRAWINGS

FIG. 2 is a diagram of one possible embodiment of the energy characterization table of FIG. 1.

FIG. 3 is a diagram of one possible embodiment of the operations table of FIG. 1.

In the following description, the use of the same reference numerals in different drawings indicates similar or identical items.

DETAILED DESCRIPTION OF ILLUSTRATIVE EMBODIMENTS

The current techniques for monitoring battery life in a battery-powered electronic device have significant drawbacks. Not only do such circuits consume power, increase the circuit costs, and consume limited space within portable devices, but such circuitry often fails to provide an accurate battery life indication.

Embodiments of systems and methods described below utilize an energy characterization table and durational information for operation of particular components (which may be stored in an operations table) to determine energy usage and to provide a battery charge indicator. Utilization of an energy characterization table provides one possible solution for a better battery life monitoring system in closed environment (i.e., in a device where power consumption for every operation is known). In such closed devices with known operations, it becomes possible to monitor each operation over a standard time (such as over one second) and to estimate the remaining battery life efficiently and accurately based on the time for each operation and without directly measuring the energy consumed. An example of a system configured to monitor battery life using energy characterization data is described below with respect to FIG. 1.

Figure 1:
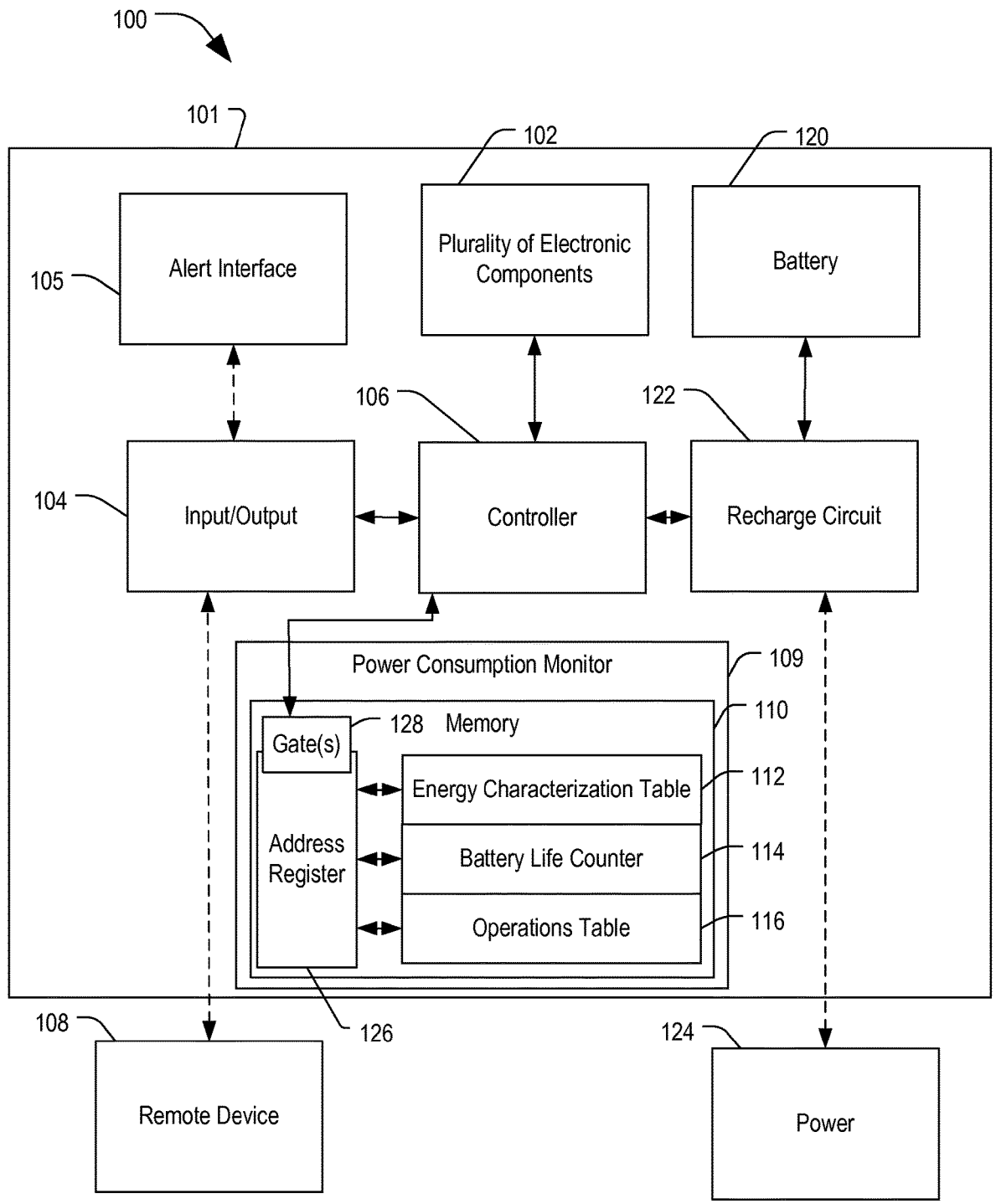
FIG. 1 is a block diagram of an electronic device configured to determine remaining battery life using energy characterization and operations tables.

FIG. 1 is a block diagram of an embodiment of a system 100 including an electronic device 101 configured to determine battery life. Controller 106 is connected to a plurality of other electronic components 102, to an input/output device 104, to a power consumption monitor, and to recharge circuit 122, which is connected to a battery 120, such as a rechargeable battery.

Input/output 104 is a connection port adapted to connect to a remote device 108 and/or to a display or other alert interface 105. Alert interface 105 may be a graphical display, a speaker, a light-emitting diode (LED), a transducer configured to cause the device 101 to vibrate, or some other interface configured to provide a visible, audible, and/or tactile feedback. In a particular example, input/output 104 is connected to an LED or other feedback interface for displaying an indication of the remaining battery life to the user, such as an LED that changes color based on the remaining battery life.

Input/output 104 may also include a wireless transceiver for radio frequency communications between electronic device 101 and remote device 108, which may include a display, one or more speakers, a keyboard/keypad/soft key interface, a touch screen, a pointer, and/or other known input/output interfaces/devices. Remote device 108 is any data processing device, such as a smart phone, a PDA (personal digital assistant), a personal computer, or other portable computing device, in communication with input/output 104. In some embodiments, input/output 104 may include multiple ports to facilitate communication between electronic device 101 and one or more devices, such as remote device 108.

Power consumption monitor 109 includes memory 110, which stores an energy characterization table 112, an operations table 116, and a battery life counter 114. Energy characterization table 112 can be generated in a lab for a closed system, such as device 101. Energy characterization table 112 includes an entry for each operation of device 101 representing the energy used over a specific time period for that operation. Operations table 116 is used by controller 106 to store operational information. For example, controller 106 adds an entry into operations table 116 including the start time and the end time for each operation. Energy counter 114 models the remaining charge value of the battery 120. In one instance, energy counter 114 is a number between the maximum charge value of the battery and zero. In operation, as electronic device 101 performs operations, controller 106 updates operations table 116 and periodically controls energy counter 114 to accurately represent the remaining charge value of the battery 120 using energy characterization table 112 and operations table 116. Controller 106 may periodically control the energy counter 114 or may control the energy counter 114 in response to detecting a user-selection or an energy consuming operation. In some examples, the memory 110 also includes an address register 126 to allow the controller 106 to access the data stored in the memory 110, such as the energy characterization table 112, the battery life counter 114, and the operations table 116. For instance, the address register 126 may be coupled to a plurality of digital gates 128 that may be accessed by the controller 106 to set the address bits.

Recharge circuit 122 is connected to battery 120 and removably connected to power source 124. Recharge circuit 122 is only activated when connected to power source 124, such as an electrical outlet. While charging the battery 120, recharge circuit 122 monitors the charge added to battery 120 and provides the information to controller 106 for updating power consumption monitor 109 and battery life counter 114 after the user disconnects power source 124. During a recharge operation, power source 124 is connected to recharge circuit 122. As current flows through recharge circuit 122 to battery 120, recharge circuit 122 monitors the charge stored by battery 124. When power source 124 is disconnected from recharge circuit 122, recharge circuit 122 provides the measured battery charge value of battery 120 to controller 106, which alters the value of battery counter 114 to reflect the state of the current battery 120.

Controller 106 controls all operations of the electronic device, including power flow to and operation of the plurality of electronic components 102. In addition to controlling their operation, controller 106 stores data in operations table 116 about each of the operations, which data includes a start time. When each operation has been completed, controller 106 stores the end time in the operations table 116. Controller 106 continues to populate operations table 116 with each operation. Periodically or in response to a user-generated trigger, controller 106 controls battery life counter 114 to update the remaining battery life based on the start and end times in the operations table 116 in conjunction with the usage per unit time values of the energy characterization table 112.

In an example, controller 106 receives a user generated trigger to display data related to the battery life. In one instance, the user selects an option by selecting a user-selectable element associated with a graphical user interface of remote device 108 to communicatively couple to input/output device 104, which selection causes the remote device 108 to send a control signal to the electronic device 101. The user may initiate the request in a variety of ways, including sending a request from remote device 108, which triggers the controller 106. Alternatively, controller 106 may receive a periodic trigger, such as from an internal timer or another internal source.

Once controller 106 receives the trigger, controller 106 calculates the total energy consumed using the entries in operations table 116 to determine a total process time and using the energy characterization table 112 to determine the total energy consumed by the operation based on the total process time. In particular, controller 106 multiplies the run time (process time) for each operation recorded in operations table 116 by the energy characterization value stored for that operation in energy characterization table 112, and the product represents a total energy used value. Controller 106 subtracts the total energy used value from the value stored by battery life counter 114 to reflect the energy consumed by the operations during the period of time between the last battery life update and the current trigger. Controller 106 then provides data related to battery life counter 114 to input/output 104 for providing a battery life indicator to remote device 108.

Since operations table 116 stores the start time and stop (end) time of each operation, it is also useful for trouble shooting and debugging in the event of a catastrophic device failure. In such an event, a manufacturer or other service provider can analyze the operations table 116 to determine the source of the failure. Further, by keeping a record of the run time for each operation in operations table 116, controller 106 can be used to predict future energy usage patterns and battery life for device 101. Over time, system 100 can develop become more and more efficient at predicting how long a battery will last before it requires recharging.

In an example, battery life counter 114 may be updated in real time whenever controller 106 determines that an operation is complete. Controller 106 calculates the energy consumed by retrieving the entry value from energy characterization table 112 corresponding to the operation and multiplying the entry value with a time difference between the start time and the end time of the operation to generate an energy-used value. The energy used value is then subtracted from battery life counter 114 to reflect the change in remaining battery life. Controller 106 updates battery life counter 114 with the updated information. It should be understood that the updating a counter and operations table 116 can be done with minimum drain on the battery making it a very efficient system and does not result in noticeable battery usage.

In this example, input/output device 104 provides data related to the battery life to either alert interface 105 within device 101. For example, if alert interface 105 is a speaker, alert interface 105 may produce an audible sound when battery life counter 114 crosses a predetermined threshold. In this way, device 101 provides the user with a signal indicating that battery 120 should be charged. In a particular example, device 101 controls the signal provided to the alert interface 105 to play a first tone when battery life counter 114 falls to 50% of its maximum, a second tone when battery life counter 114 falls to 25% of its maximum, and a third tone when battery life counter 114 fall to 5% of its maximum. In another example, alert interface 105 includes an LED configured to turn on when battery life counter 114 reaches a predetermined amount. In this example, alert interface 105 may also change colors based on the value of battery life counter 114 to indicate a state of the battery life.

Alternatively, input/output 104 provides a signal to remote device 108, which can include a display (such as a touch screen that operates to receive user input and to display information to the user). Remote device 108 is configured to receive information representative of the remaining battery life and, in response thereto, to present a visual representation of the remaining battery life to a user. The visual representation can be displayed as a percentage of the maximum level, a bar representative of the percentage of the maximum level, a factor of time, a picture of a battery having a fill-color that depends on the remaining battery life, or a number. For example, remote device 108 may display battery life indicator as a battery bar indicating the percentage left and a number of hours/minutes remaining by converting data related to the value of battery life counter 114 into a factor of time.

In some instances, operations table 116 and energy characterization table 112 may be combined into a single table. In such an instance, selected fields of the table may be updated with operational information, while energy usage data remains unchanged. Further, while power consumption monitor 109 is depicted as including a memory 110, it should be understood that power consumption monitor 109 may be a circuit or combination of other components configured to monitor or infer the remaining battery life. In such an instance, memory 110 may be a separate component configured to store data. While FIG. 1 is a diagram of the system 100 capable of utilizing energy characterization table 112, FIG. 2 is a diagram of an example of an energy utilization table.

FIG. 2 is a diagram of one possible embodiment of energy characterization table 112 of FIG. 1. Energy characterization table 112 includes a list of operations, such as a first microcontroller unit operation (MCU(1)), a second MCU operation (MCU(2)), a first digital signal processor (DSP) operation (Processor(1)), and so on. Each entry for an operation in the energy characterization table 112 includes a characterization of the energy consumed by the operation normalized over a period of time. In this example, the energy consumed is normalized as energy consumed per second. There is an entry for each operation of each component of the plurality of electrical components 102. Each entry may also have a different energy usage/per time value because different components may consume different amounts of energy when operating (and/or depending on the operation being performed). For example, MCU(2) may represent an add operation and MCU(1) may represent a subtract operation. In this example, the add operation uses more energy than the subtract operation, so MCU(2) has a higher energy value entry in energy characterization table 112. In another example, entries may represent higher level operations. In one example processor(1) represents a modulate audio signals operation and processor(2) represents a conversion operation, such as a convert digital to analog operation.

In an example, the manufacturer may trigger each of the operations using a test procedure and measure the energy consumed, allowing the manufacturer to characterize each operation and populate the energy characterization table 112 accordingly. In this way, energy usage for each operation of device 101 is characterized in a read only table that can be saved in memory and used as a reference for how much energy is used per operation per second.

Once the energy characterization table 112 is created, it is available for use to estimate energy consumed over time when a particular operation is performed. Calculation or estimation of the consumed energy makes use of an operations table that tracks the duration of each operation. An example of the energy characterization table 112 is described below with respect to FIG. 3.

FIG. 3 is a diagram of one possible example of operations table 116 of FIG. 1. Operations tale 116 includes a list of processes or operations, and the start and end times during which such operations were performed. In this example, each operation's name, start time, and end time are recorded such that the total run time for each operation can be calculated. Some operations have been performed multiple times, as is the case with operation MCU(1), in which case, each instance of the operation is recorded as a separate entry in the operations table 116 with different start and stop times. It is also possible that one operation is not yet completed, as in the case of Microphone(1) where the microphone is turned on but not yet turned off. The end time for an operation is not recorded until the process or operation is stopped. Accordingly, the end time for Microphone (1) is not yet recorded.

In another embodiment, operations table 116 may also include a column for total time that is determined when the end time is entered or in response to a trigger, such as a timer or a user-initiated request. It is also understood that more columns may be added to record additional data corresponding to the operations for use in troubleshooting or debugging, for example, in the event of a catastrophic failure.

It should be understood that the system of FIGS. 1-3 including energy characterization table 112 and operation table 116 may be represented in hardware to perform the battery life monitoring. For example, an RTL design could be used by representing energy characterization table 112 and operation table 116 in registers and utilizing digital gates to record the start and stop time of each operation.

It should be appreciated that a pre-configured operations table 116 and a pre-configured energy utilization table 112 provide less-than-accurate estimates in an "open" system that allow for hardware modifications and/or the connection of external components that draw power from the battery 120. However, in closed systems that have a known and fully characterized configuration that cannot be changed by the user, such information can be used to determine highly accurate battery life measurements. An example of such a closed system is a hearing aid, such as that described below with respect to FIG. 4.

Figure 4:
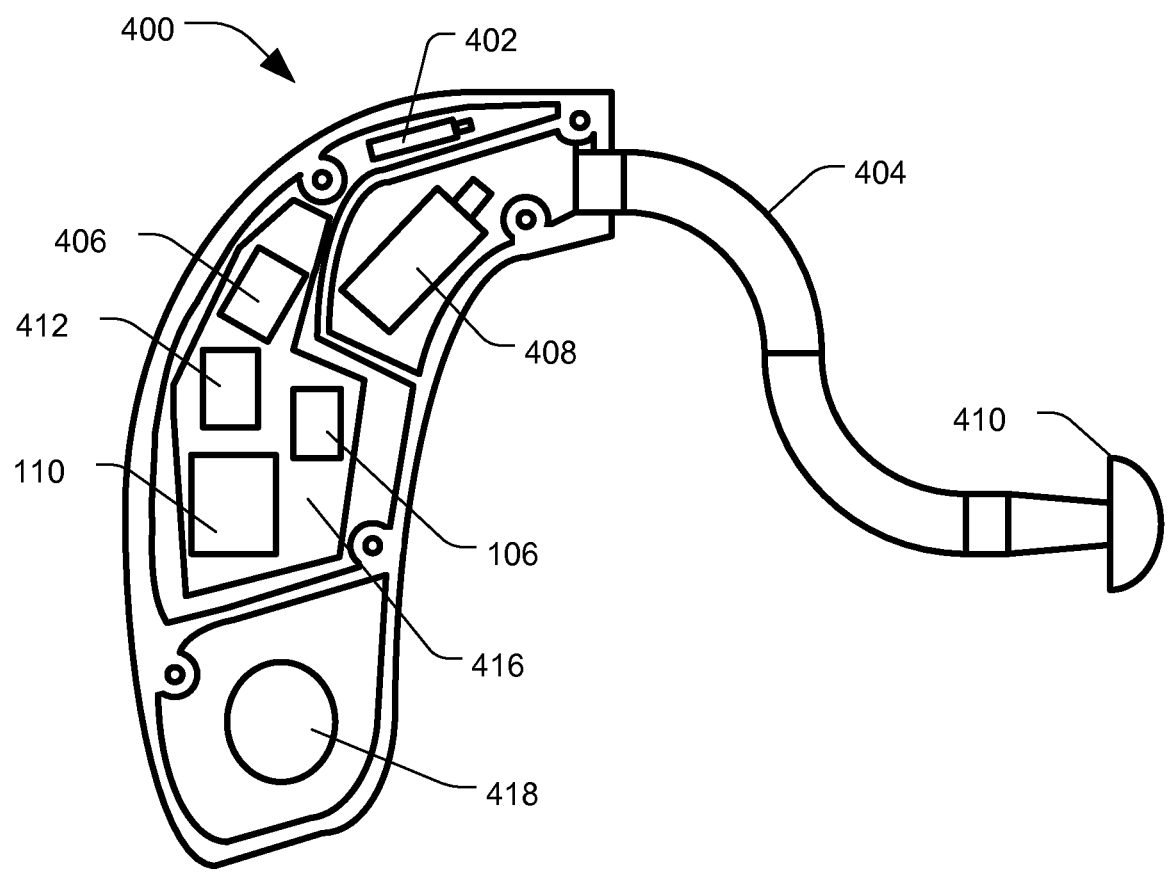
FIG. 4 is a cross-sectional view of an embodiment of a hearing aid configured to utilize an energy characterization table to determine battery life.

FIG. 4 is a cross-sectional view of a hearing aid 400, which is one possible implementation of electronic device 101, configured to utilize energy characterization table 112 and operations table 116 in FIGS. 1, 2, and 3, to determine battery life. Hearing aid 400 includes a microphone 402 to convert sounds into electrical signals. Microphone 402 is connected to circuit 416, which includes at least one processor 406, controller 106, transceiver 412, and memory 110. Further, hearing aid 400 includes a speaker 408 connected to processor 406 via electrical leads (not shown) and configured to communicate audio data through ear canal tube 404 to an ear piece 410, which may be positioned within the ear canal of a user. Further, hearing aid 400 includes a battery 418 to supply power to the other components.

In an example, microphone 402 converts sounds into electrical signals and provides the electrical signals to processor 406, which processes the electrical signals according to a sound shaping algorithm to produce a modulated output signal that is customized to a user's particular hearing ability. The modulated output signal is provided to speaker 408, which reproduces the modulated output signal as an audio signal and which provides the audio signal to ear piece 410 through ear canal tube 404. In an alternative embodiment, speaker 408 may be included within ear piece 410 and may be coupled to circuit 416 by a wire extending through ear canal tube 404.

Because all of the operations above can be characterized in a lab to generate an energy characterization table, hearing aid 400 with controller 106 provides an example of device 101 of FIG. 1. In this example, operations table 116, energy characterization table 112, and energy counter 114 can be stored locally in memory 110. Further, speaker 408 may act as the input/output 104 of FIG. 1 and may produce tones in response to battery life counter 114 reaching predetermined values. In some embodiments, controller 106 may be implemented as a microcontroller unit (MCU) executing instructions stored in a memory (not shown). Alternatively, controller 106 may be implemented as a process executing on processor 406.

In some instances, transceiver 412 operates as an input/output terminal, such as input/output 104 of FIG. 1. Transceiver 412 provides wired or wireless communication to a remote device, such as remote device 108.

FIG. 4 shows a cross-sectional view of the internal components of a behind-the-ear hearing aid 400 which are utilized to calculate and provide data related to the updated battery life counter 114. It should be appreciated that the types of hearing aids and/or other types of electronic devices may also be used. Further, while the above-example described an audio signal to provide an audible indicator via speaker, the battery life indicator may be sent by the hearing aid to a remote device 108 and presented on a user interface associated with the remote device 108 as described below with respect to FIG. 5.

Figure 5:
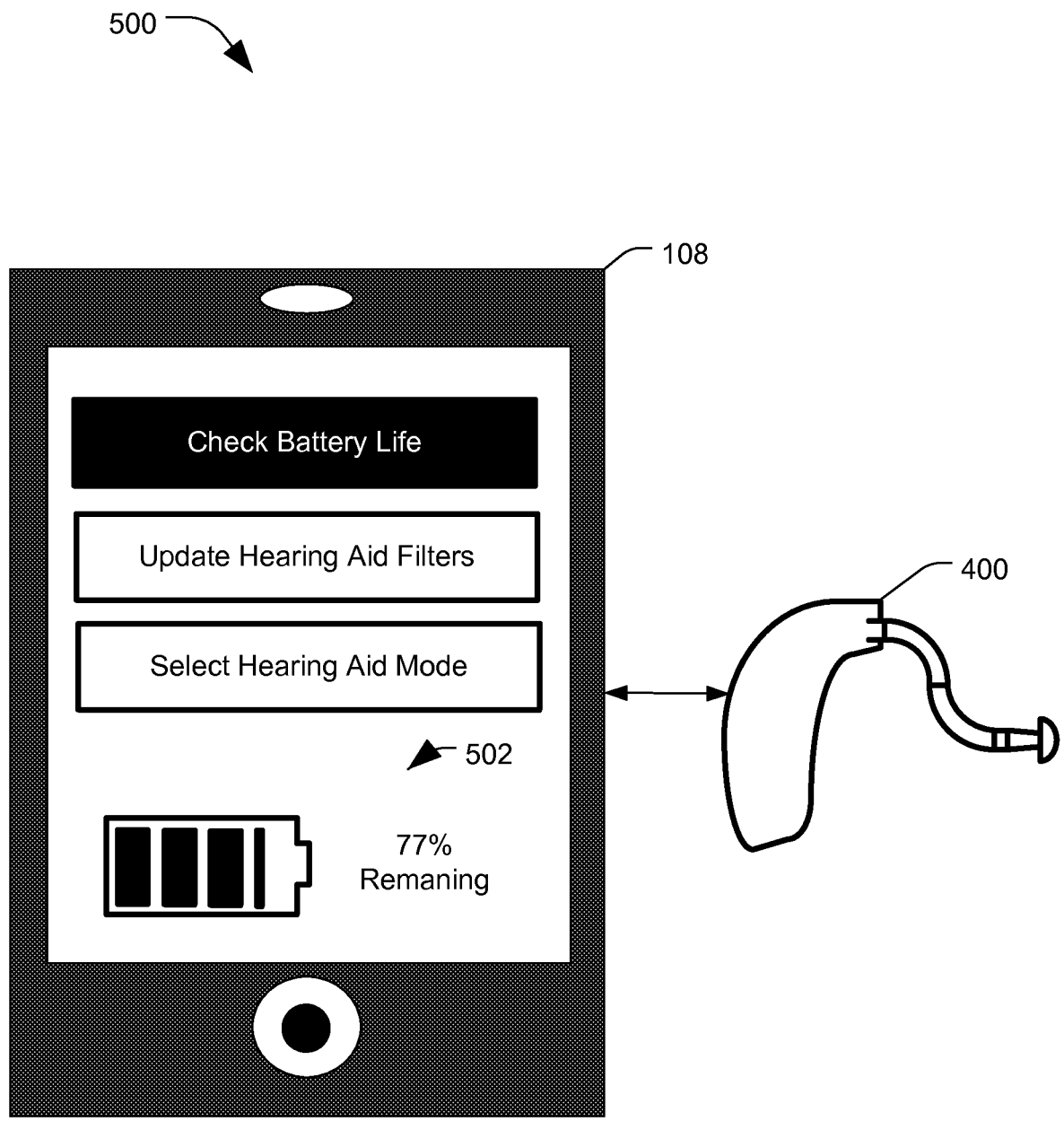
FIG. 5 is a diagram of an embodiment of a system including a hearing aid and remote device configured to provide a user interface and to utilize an energy characterization table.

FIG. 5 is a view of a system 500 including a hearing aid 400 and remote device 108 configured to utilize an energy characterization table, such as energy characterization table 112 of FIG. 1. Hearing aid 400 communicates with remote device 108 through a wireless, short-range communications channel. In this instance, remote device 108 is configured to execute processor-readable instructions to control parameters and settings of hearing aid 400. In particular, remote device 108 includes a touch screen interface 502 for displaying information and for receiving user input. Further, remote device 108 includes a wireless transceiver (not shown) for communicating data to and from in hearing aid 400.

FIG. 5 shows a system 500 including hearing aid 400 and remote device 108 illustrating one possible battery life display interface on remote device 108. Touch screen interface 502 includes options such as "Check Battery Life" (which is depicted as having been selected), "Update Hearing Aid Filters", and "Select Hearing Aid Mode". In the illustrated example, the "Check Battery Life" option is selected, so the battery life indicator is displayed. In this instance, the indicator includes a battery-shaped bar and a percentage of remaining battery life. The battery life indicator can be updated every time the user selects the "Check Battery Life" option.

In one example, in response to the user selecting the "Check Battery Life" option on remote device 108, remote device 108 sends a signal to hearing aid 400 through the wireless communication channel requesting the current battery life information for hearing aid 400. Controller 106 (shown in FIG. 1) in hearing aid 400 calculates the remaining battery life using energy characterization table 112, operations table 116, and energy counter 114 as described with respect to FIG. 1 and provides data related to the battery life to remote device 108 for display using input/output interface 104 (which, as previously indicated, may be a wireless transceiver).

In an alternative example, the battery life indicator may be displayed continuously and remote device 108 may make periodic requests to hearing aid 400 for an update to the remaining battery life indicator. In this way the battery life display is updated periodically without the need for the user to select the "Check Battery Life" option.

It should be appreciated that a hearing aid application executed by a processor of remote device 108 includes a variety of capabilities. In response to user selection of the "Update Hearing Aid Filters" option, the hearing aid application causes the processor to provide a graphical user interface that includes one or more user-selectable options to allow the user to configure the audio filters applied by the hearing aid. In response to user selection of the "Select Hearing Aid Mode" option, the hearing aid application causes the processor to provide a graphical user interface that includes one or more user-selectable options for updating the operating mode of the hearing aid 400.

Figure 6:
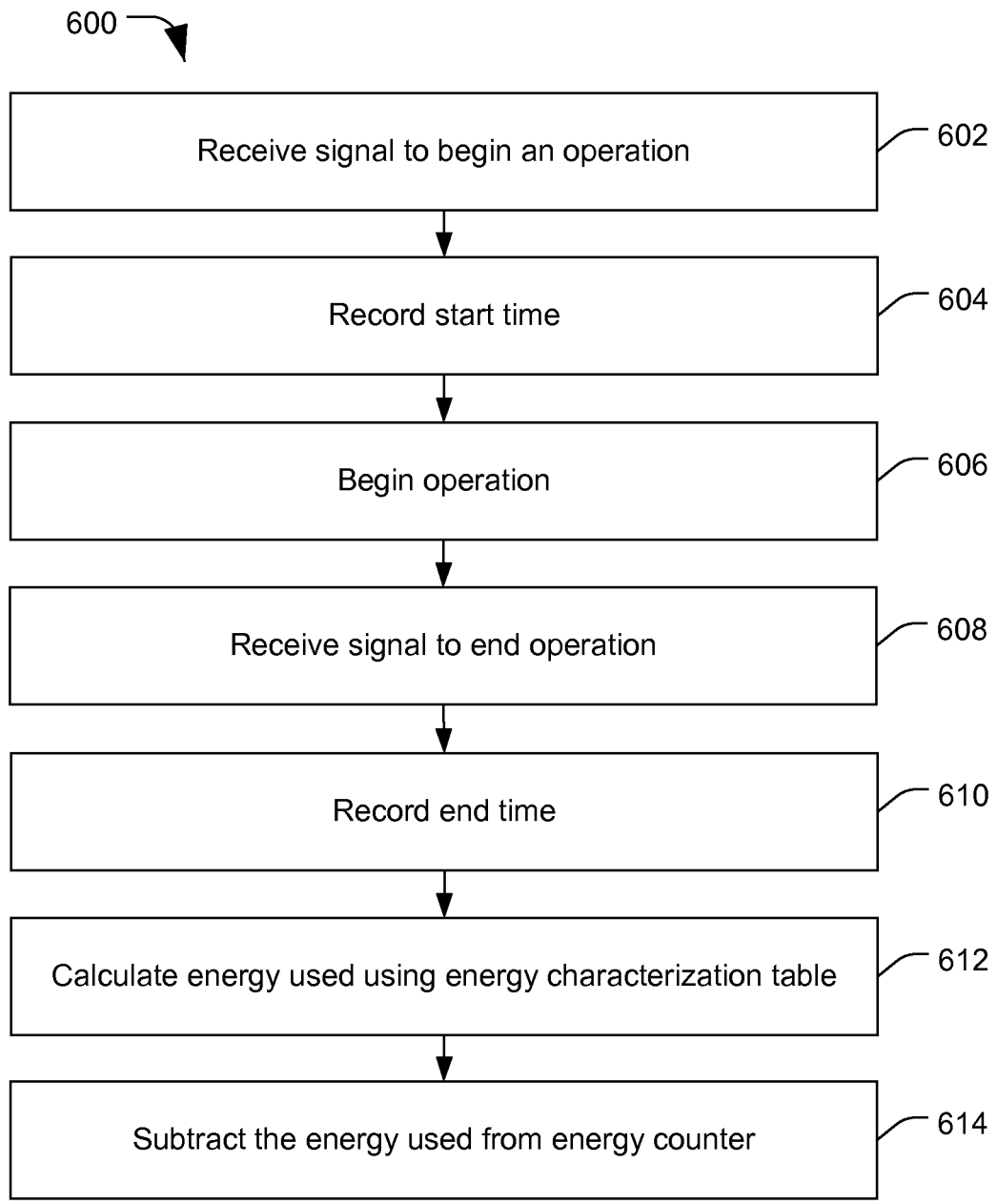
FIG. 6 is a flow diagram of an embodiment of a method of utilizing an energy characterization table to determine the reaming charge on a battery.

FIG. 6 is a flow diagram of an embodiment of a method 600 utilizing energy characterization table 112 to determine battery drain. At 602, controller 106 receives a signal to begin an operation. Proceeding to 604, controller 106 records the start time in operations table 116. Advancing to 606, controller 106 controls one or more components to perform the operation. Proceeding to 608, controller 106 receives a signal indicating the end of the operation. In some instances, the signal may be an interrupt or another signal causing controller 106 to end the operation. In an alternative embodiment, controller 106 determines that the operations have been completed. Advancing to 610, controller 106 records the end time in operations table 116.

Progressing to 612, controller 106 calculates the energy used for the particular operation using energy characterization table 112 and using the recorded start time and end time from operations table 116. Controller 106 may calculate the energy used periodically or in response to a trigger from remote device 108. Controller 106 looks up the energy characterization of the operation in the energy characterization table 112 to determine the energy used per unit time for the particular operation and then multiples that energy usage value by the total run time of the operation (as determined by a difference between the start and end times for the operation) to determine the energy used. Advancing to 614, controller 106 subtracts the energy used from battery life counter 114 to reflect the change in battery life due to the operation.

In an alternative example, controller 106 may populate operation table 116 with the start and end time of each operation and only calculate energy used in response to a trigger generated by either by an internal clock or a user. In this way, battery life counter 114 is updated only when the trigger is received by controller 106.

Figure 7:
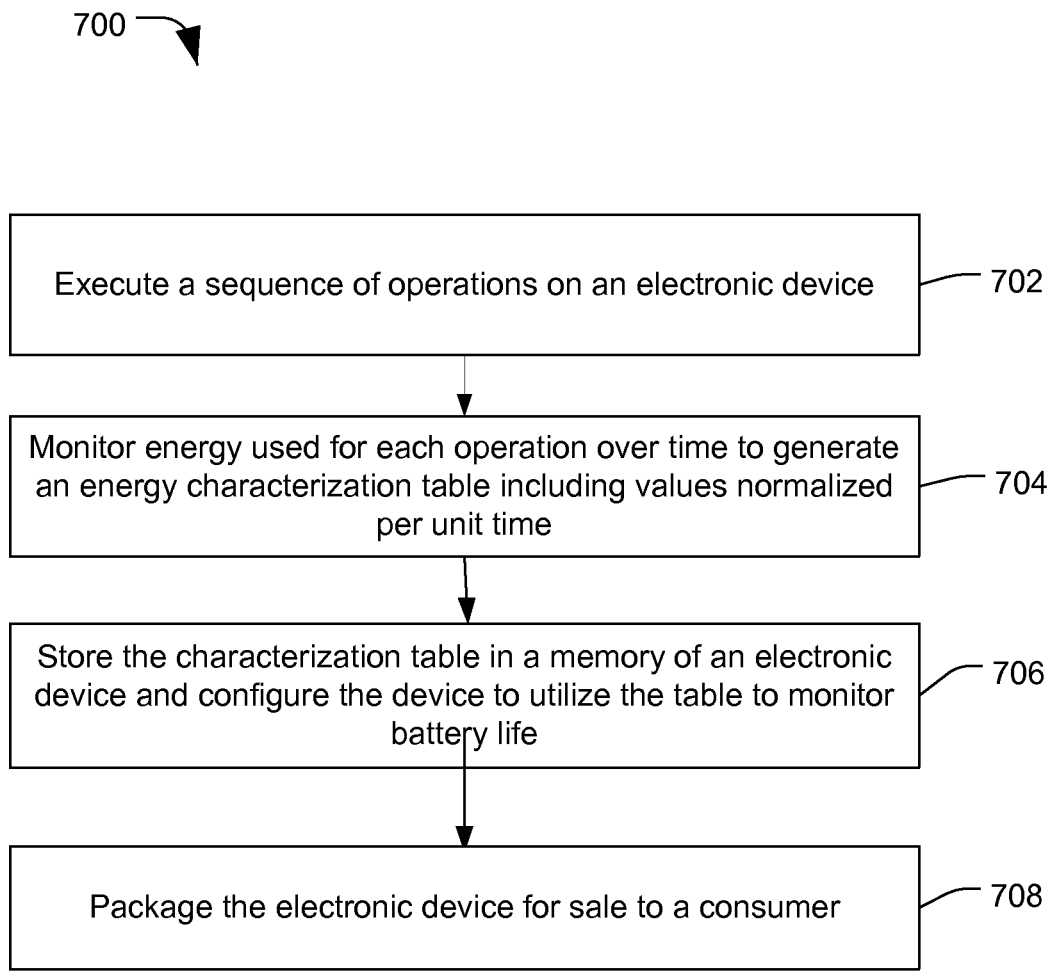
FIG. 7 is a flow diagram of an embodiment of a method of producing an energy characterization table for a device.

FIG. 7 is a flow diagram of a method 700 of producing an energy characterization table 112 for a device. At 702, controller 106 executes a sequence of operations on the electronic device 101. In an example, controller 106 may be controlled by remote device 108 via input/output 104 to cause the controller 106 to execute the sequence of operations. In another example, electronic device 101 may perform one or more operations (such as audio signal processing) automatically. Advancing to 704, energy usage is measured for each operation over time to generate an energy characterization table 112 including values normalized per unit time. The power consumed by every component during each operation is determined and normalized over a selected time unit to produce an energy usage value per unit of time, which is recorded in energy characterization table 112. Block 704 may be performed by a manufacturer or may be performed by a processor electronic device 101 using a calibration operation. Advancing to 706, the energy characterization table 112 is stored in a memory of an electronic device 101, which is configured to utilize energy characterization table 112 to determine a remaining battery life. Proceeding to 708, the electronic device is packaged for the consumer.

In conjunction with the systems and methods described above with respect to FIGS. 1-7, an electronic device, such as a hearing aid, is disclosed that includes a power consumption monitor configured to calculate a remaining charge on a battery based on the duration of operations executed by circuitry of the hearing aid. In particular, an energy characterization table 112 and an operations table 116 are used to determine the amount of energy consumed based on a duration of each operation, and a battery monitor 114 models the remaining battery life. In particular, the system determines the duration of a particular operation and multiplies the duration by an energy usage value (amount of energy consumed per unit time) from the energy characterization table 112 to determine the energy consumed, which can be subtracted from the current battery charge value to determine the remaining charge on the battery. The systems provide a method of accurately estimating the power stored by the battery without directly measuring the voltage or current of the battery. Thus, energy utilization table 112 can replace continuous or periodic monitoring of the voltage or current, saving money and circuit space and reducing battery drain.

In one particular implementation, an apparatus including a power consumption monitor system, as described herein, includes at least one register or memory to store an energy characterization table and an address register for accessing the data stored within the energy characterization table. In some cases, a plurality of digital gates may be coupled to the address register to set address bits within the address register corresponding to operation of one or more of the plurality of circuit components of the apparatus. In some cases, the power consumption monitor is coupled to the address register and the at least one register, the power consumption monitor configured to multiply an operating time of an operation by an energy characterization value per unit time corresponding to the operation that is stored in the energy characterization table at an address corresponding to the address bits from the address register to produce a usage value, the power consumption monitor to calculate the remaining battery life by subtracting the usage value from a current remaining battery life value.

In another particular implementation, an electric device may be a hearing aid, as described above. In some cases, the hearing aid may be configured to perform operations or a plurality of operations associated with modulating an audio signal captured by a microphone of the hearing aid to compensate for a hearing deficiency of a user.

Although the present invention has been described with reference to preferred embodiments, workers skilled in the art will recognize that changes may be made in form and detail without departing from the scope of the invention.

What is claimed is:

1. A wearable device, comprising:
a battery having a remaining battery charge value;
a memory configured to store an energy counter corresponding to the remaining battery charge value;
a plurality of electronic components; and
a controller coupled to the battery, the memory, and the plurality of electronic components, wherein the controller is configured to—
receive, from a remote device, a first signal indicative of a request for information related to the remaining battery charge value, wherein the remote device is a portable computing device comprising a display, and wherein the remote device is a different type of device from the wearable device;
estimate an energy usage of an operation performed by at least one of the plurality of electronic components wherein the energy usage is normalized to create an energy characterization value per unit time of the operation, and wherein estimating the energy usage comprises multiplying the an operation time and the energy characterization value per unit time associated with the operation in an energy characterization table;
calculate an updated energy counter by subtracting the estimated energy usage from the energy counter; and
transmit a second signal indicative of the updated energy counter to the remote device,
wherein the operating time is determined from an operation table recording a start time and an end time for the operation performed by the at least one of the plurality of electronic components, and
wherein the change of battery charge value that occurs during the calculation and transmission steps is unnoticeable.

2. The wearable device of claim 1, further comprising:
a recharge circuit coupled to the battery and to the controller, wherein the recharge circuit is configured to couple the battery to a power source to recharge the battery during a recharge operation, and
wherein the controller is further configured to update the energy counter when the recharge operation ends.

3. The wearable device of claim 1, wherein the controller is further configured to determine a start time and an end time of each operation performed by one or more of the plurality of electronic components.

4. The wearable device of claim 1, further comprising:
a power consumption monitor coupled to the controller and the memory, wherein the power consumption monitor comprises:
at least one register configured to store the energy characterization table;
an address register; and
a plurality of digital gates coupled to the address register to set address bits within the address register corresponding to an operation of one or more of the plurality of electronic components wherein the energy characterization value per unit time corresponds to the operation that is stored in the energy characterization table at an address corresponding to the address bits from the address register.

5. The wearable device of claim 1, wherein the energy characterization table is stored on the memory.

6. The wearable device of claim 1, further comprising:
a transceiver coupled to the controller and configured to receive the first signal and transmit the second signal.

7. The wearable device of claim 6, further comprising:
a user interface configured to output information related to the remaining battery charge value to a user.

8. The wearable device of claim 1, wherein the controller keeps a record of an operating time for each operation performed by at least one of the plurality of electronic components in the operation table and the controller updates the battery charge value based on the record of the operating time for each operation.

9. The wearable device of claim 1, further comprising an alert interface, wherein the alert interface includes at least one of a graphical display, a speaker, a light-emitting diode, or tactile device.

10. A non-transitory computer-readable storage medium containing instructions stored therein for causing a computer processor to perform:
storing a start time of an operation performed by a wearable device, wherein the operation is selected from one of a plurality of operations associated with a corresponding energy usage per unit of time in an energy characterization table stored in a memory of the wearable device;
receiving, from a remote device, a signal indicative of a trigger to provide information related to a battery charge value of the wearable device, wherein the signal is received during the operation, wherein the remote device is a portable computing device comprising a display, and wherein the remote device is a different type of device from the wearable device;
updating the battery charge value of the wearable device by an amount of energy corresponding to a product of the period of time and the corresponding energy usage per unit time of the operation; and
transmitting a value indicative of the updated battery charge value from the wearable device to the remote device in response to the signal, and
wherein the change of battery charge value that occurs during the calculation and transmission steps is unnoticeable.

11. The computer-readable storage medium of claim 10 wherein updating the battery charge value includes subtracting the product of the period of time and the corresponding energy usage per unit time of the operation from the battery charge value.

12. The computer-readable storage medium of claim 11 wherein the operation comprises a recharge operation including monitoring the increase in the battery charge value, and providing the recharge operation information to the wearable device for updating the battery charge value.

13. The computer-readable storage medium of claim 12 wherein receiving the signal includes receiving the signal from the remote device in response to user input requesting information related to the battery charge value of the wearable device.

14. A method of determining a battery charge value of a device, the method comprising:
recording a first time in a memory on the device, wherein the first time corresponds to a start time of an operation performed by an electronic component on the device;
receiving at the device a request from a remote device for information related to the battery charge value of the device, wherein the request is received during the operation, wherein the remote device is a portable computing device comprising a display, and wherein the remote device is a different type of device than the device;
in response to receiving the request at the device—
determining a duration of time between the first time and when the request is received;
calculating an amount of energy used during the duration of time, wherein calculating the amount of energy comprises multiplying the duration of time and an energy usage per unit of time associated with the operation; and
determining a difference between the calculated amount of energy used and the battery charge value to determine an updated battery charge value;
transmitting a signal indicative of the updated battery charge value to a computing device communicatively coupled to the device; and
displaying, at the computing device, information related to the updated battery charge value, and
wherein the change of battery charge value that occurs during the calculation and transmission steps is unnoticeable.

15. The method of claim 14, wherein the plurality of operations include at least one audio signal processing operation for modulating an audio signal to compensate for a hearing deficiency of a user.

16. The method of claim 15, further comprising providing a battery life indicator related to the battery charge value.

17. The method of claim 16, wherein providing the battery life indicator comprises activating a visual, audio, or tactile feedback element to provide a user-detectable indicator.

* * * * *